United States Patent [19]
Clemen et al.

[11] Patent Number: 5,949,723
[45] Date of Patent: Sep. 7, 1999

[54] FAST SINGLE ENDED SENSING WITH CONFIGURABLE HALF-LATCH

[75] Inventors: Rainer Clemen, Böblingen; Herald Mielich; Jürgen Pille, both of Stuttgart, all of Germany

[73] Assignee: International Business Machines Corporation, Armonk, N.Y.

[21] Appl. No.: 09/126,241

[22] Filed: Jul. 30, 1998

[30] Foreign Application Priority Data

Jul. 28, 1998 [EP] European Pat. Off. .............. 98114064

[51] Int. Cl.$^6$ ....................................... G11C 7/00
[52] U.S. Cl. ........................... 365/196; 365/57; 365/177; 365/189.05
[58] Field of Search ..................................... 365/196, 201, 365/57, 77, 104, 186, 177, 189.05

[56] References Cited

U.S. PATENT DOCUMENTS 5,798,980 8/1998 McClure .................................. 365/233
5,831,467 11/1998 Leung et al. ............................ 327/319

Primary Examiner—David Nelms
Assistant Examiner—Thong Le
Attorney, Agent, or Firm—Larry D. Cutter; Lynn L. Augspurger

[57] ABSTRACT

For high-speed single-ended sensing of the signal from a (multi-port) SRAM cell, a configurable half-latch with 2 PFET feedback pathes is proposed, which can be set up either as a bleeder device in the system mode or as keeper devices in the test modes, controlled by a DC signal (TEST). The bleeder and keepers are attached to the bit line and gated by a small ratioed inverter serving as sense amplifier. In case of system mode, a low control signal is applied to the source of the bleeder to limit the bit line up-level to a threshold below the supply voltage Vdd. Thus, discharging the bit line when reading a '0' is fast. Reading a '1' is also fast by skewing the inverter to a PFET/NFET ratio below 1. For chip testing, the control signal is set high to enable the keepers which restore the bit line close to the supply voltage, even when large subthreshold currents try to discharge it via the unselected cells. This turns off the PFET of the inverter, thereby minimizing the DC current. The new approach improves the access time by about 10%, since no speed must be sacrificed for low-power operation during reliability tests at high voltage (1.5× to 2× Vdd) and temperature.

4 Claims, 9 Drawing Sheets

NOTE:
FET DESIGN WIDTH IN MICRON (u), UNSCALED.
Weff = 0.45 x WDESIGN − BIAS
FET DESIGN LENGTH = 0.5 u, UNSCALED.
   IF NOT OTHERWISE STATED.
Leff (NFET) = 0.12 u.
Leff (PFET) = 0.15 u.

FAST SINGLE ENDED SENSING WITH CONFIGURABLE HALF-LATCH

FIELD OF THE INVENTION

The invention relates to the sensing scheme for a static random access memory (SRAM), in particular to a single-ended sense amplifier which can sense and amplify the signal developed on a single bit line.

DESCRIPTION OF THE PRIOR ART

High-speed RAMs which use minimum-size memory cells require special circuitry to sense and amplify the small signal which is delivered by the cell when selected for a read operation. Such sense circuits need to be designed very carefully so that the signal is detected reliably during both a read '0' and a read '1' operation. This especially applies for SRAMs, even though they already use latch-type memory cells with some inherent amplification. For high-speed operation, they need additional amplifying means in the peripheral circuitry of the data path. The prefered approach for a single-port SRAM is to use a 6-device cell as storage element and to attach a column sense amplifier to the bit line pair, which allows differential sensing. High-density multi-port SRAMs, however, usually permit only single-ended sensing, because the memory cell must be minimized with respect to the number of transistors and input/output (I/O) lines. For example, a n-port SRAM cell with n data ports contains n I/O transistors and n bit lines (column data lines) and n word lines (row select lines). The I/O transistors are usually implemented by N-channel field-effect transistor (NFET) pass gates at both the read and the write ports. Using CMOS transmission gates would duplicate the number of I/O transistors as well as the number of word lines and increase the required layout area.

FIG. 1 shows a conventional CMOS embodiment for such a sensing scheme with single-ended sensing as disclosed in U.S. Pat. No. 5,473,574 to Clemen et.al. For each cell 1 . . . n, only one inverter $I_c1$ . . . $I_c$n and one read port NFET N1 . . . Nn is displayed. The memory cells are connected to a sense amplifier via a single read bit line BL. In a simple approach, the sense amplifier is realized by an inverter I1. In case of a stored '0' corresponding to a low level at cell node B1, the cell discharges the bit line BL and the inverter I1 delivers the inverse signal, i.e. a high level. In case of a stored '1', the cell pulls up the bit line BL, and the inverter I1 generates a low level at its output DL.

The major problem with this single-ended SRAM scheme involving NFET pass gates in the memory cell is that the bit line up-level depends on the data pattern stored in the unselected cells and the magnitude of the subthreshold currents particularly through the read port NFETs N2 . . . Nn of these cells.

If all unselected cells contain a logical '0' corresponding to a low level, the bit line BL will reach only an up-level of Vdd-VTn, as delivered initially by the selected read port NFET N1 (Vdd=supply voltage; VTn=threshold voltage of cell NFET pass gate). On the other hand, if the unselected cells contain a logical '1' corresponding to a high level equal to the supply voltage Vdd, the bit line BL may slowly drift towards Vdd due to the subthreshold currents provided by the selected cell, even though initially it is driven only to Vdd-VTn by the selected port NFET N1. Thus, in case of a read '1' operation, the bit line BL can reach any (high) voltage level between Vdd-VTn and Vdd, depending on the logic level stored in the unselected cells (FIG. 4). This has the disadvantage that the read '0' access time varies with the bit line up-level.

In the past, this problem could be solved by adding a small pull-up or so-called keeper device P0 to the bit line BL, in order to provide a defined up-level voltage in the steady state and to keep it at this level, which is equal to the supply voltage Vdd. FIG. 1 shows a solution with the well-known half-latch configuration, where the gate of a PFET keeper device P0 is a connected to the output of an inverter I1 attached to the bit line BL.

However, with the ever decreasing channel length of the CMOS devices, the threshold voltages decrease and the subthreshold currents become larger and larger, so that a bigger keeper device P0 is neccessary to compensate for the subthreshold current flowing through the NFETs N2 . . . Nn and trying to discharge the bit line BL in case of stored zero-levels.

Obviously, the suitable keeper size depends on the number of memory cells (n) attached to the bit line BL. For example, a channel width-to-length ratio of W/L=1 $\mu$m/0.5 $\mu$m (unscaled dimensions) is typically needed for n=32 and 8 $\mu$m NFETs N1 . . . Nn, when using CMOS7S/SOI technology (scaling factor: 0.45, $L_{eff}$n=0.12 $\mu$m, $L_{eff}$p=0.15 $\mu$m, Vdd=1.8 V; $L_{eff}$=effective channel length).

In general it is very difficult to exactly determine the required minimum device size, because usually the device model used for the simulations is pretty inaccurate in the subthreshold regime (by about±100%). Therefore, the designer will be cautious and rather build in some contingency, i.e. increase the device size by two times over the the value suggested by the simulation.

Furthermore, high-quality CMOS products require high-voltage screen tests and burn-in tests to ensure reliable circuit operation in the field. In particular at burn-in conditions with larger voltages (e.g. 1.5×Vdd) and temperatures (T=140° C.), the subthreshold currents become even larger, especially on hardware from the fast process corner with minimum channel lengths (FIG. 5). This in turn demands a bigger keeper size.

A larger keeper size, however, would degrade the performance when reading a '0' (FIG. 5), since the selected memory cell must overwrite the half-latch. In other words, operating performance (at Vdd) must be given up in order to guarantee full functionality and a managable power budget during the reliability tests.

OBJECT OF THE INVENTION

The primary objective of the invention is to provide a fast fully-static single-ended sensing scheme for a multi-port SRAM. Another objective is to provide a sense circuit which ensures full functionality during leakage tests as well as during reliability tests, particularly power management at high voltages (e.g. 1.5×Vdd) above the nominal operating voltage Vdd, without compromising the performance at normal system operations where the supply voltage is Vdd.

SUMMARY OF THE INVENTION

To resolve this particular performance/power tradeoff, it is suggested to introduce a circuit comprising a configurable half-latch with switchable keeper devices. Special control means are provided to set up the circuit for either the normal operating mode, i.e. the system run mode with fast signal amplification, or for the test modes, i.e. the standby leakage test and particularly the high-voltage/high-temperature reliability screen tests with low power consumption of the circuit.

The proposed single-ended sensing scheme provides the optimum design point for high-speed multi-port SRAM operation at Vdd (e.g. 1.8 V) and functionality at high voltages up to 2×Vdd (e.g. 3.6 V). It allows to minimize the worst case access time at the low-voltage test corner (Vdd−x %; Vdd=nominal supply voltage), without sacrificing performance for low-power operation at high or excessive voltages under best case conditions (with minimum effective channel lengths of the FETs). By using a small skewed inverter with a switchable PFET feedback loop, the swing on the bit line can be adjusted for high-speed system mode or low-power test mode, depending on the supply voltage. Compared to the conventional scheme, the new approach leads to an access time improvement in the order of 10%. The sensing is fully static and self-timed, that is no timing chain is needed, which still allows a simple design. By using stronger keeper devices, functionality at high-voltage screen tests is improved. Leakage at burn-in is decreased by a factor of 6. With the use of the present invention it is possible to further use NFET pass gates instead of CMOS transmission gates, thus saving layout area.

3 waveforms with size of keeper P0 as parameter (channel width W=1,2,4 μm unscaled)

Figure 6:
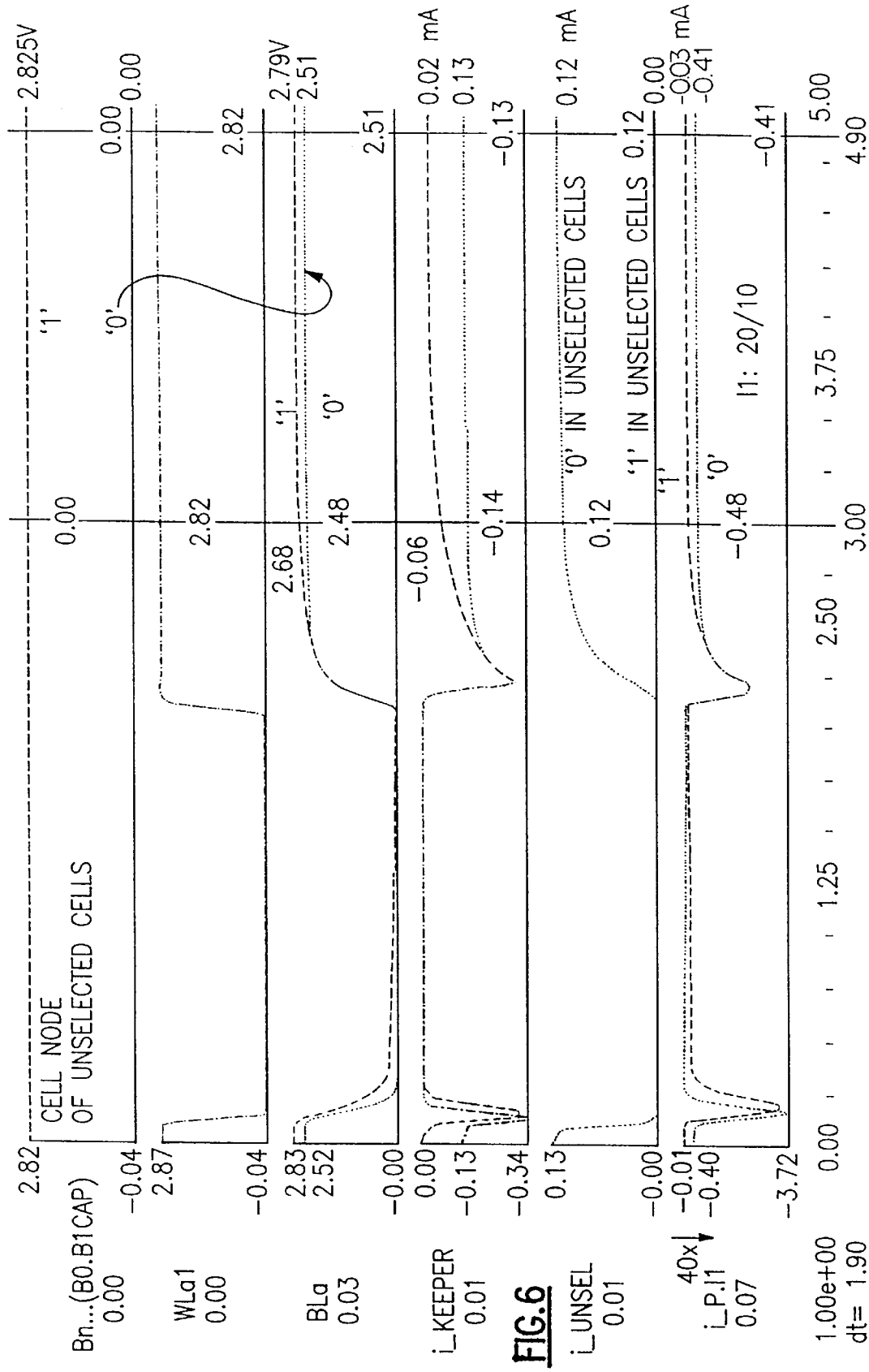

FIG. 6 Switching behavior of prior art sensing scheme at burn-in conditions, i.e. 1.5×Vdd=2.825 V (including 0.125 V tester tolerance), T=140° C., NRN=0.00;

dotted waveforms: '0' stored in 31 unselected cells;

dashed waveforms: '1' stored in 31 unselected cells

Figure 7:
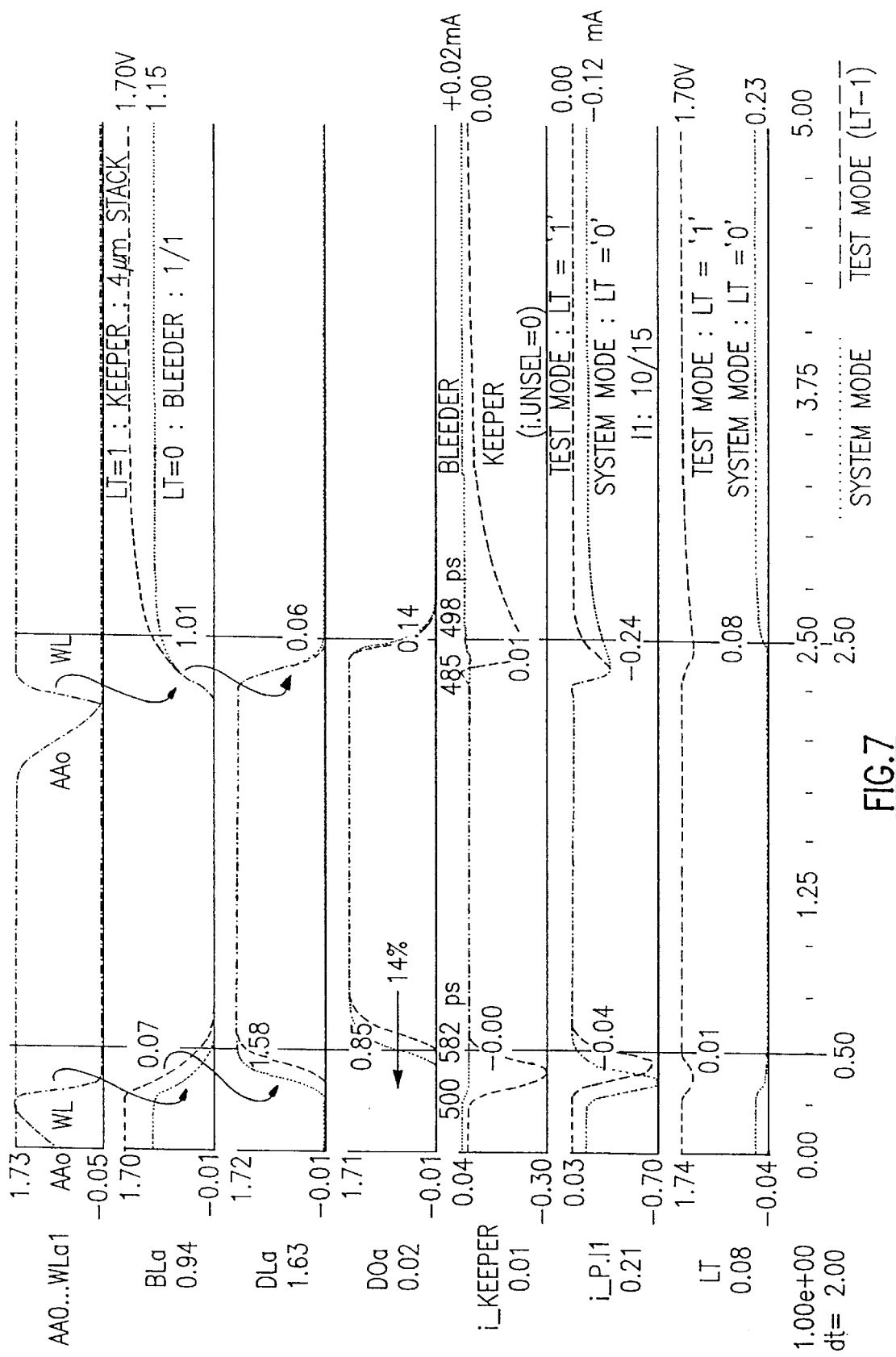

FIG. 7 Switching behavior of new sensing scheme in system mode and in test mode at typical conditions, i.e. 0.92×Vdd=1.70 V, T=65° C., NRN=0.50;

dotted waveforms: LT=0: normal system run mode with bleeder (W/L=1/1);

dashed waveforms: LT=1: leakage test mode with with keepers (W/L=1/1 and 4/0.5 stack)

Figure 8:
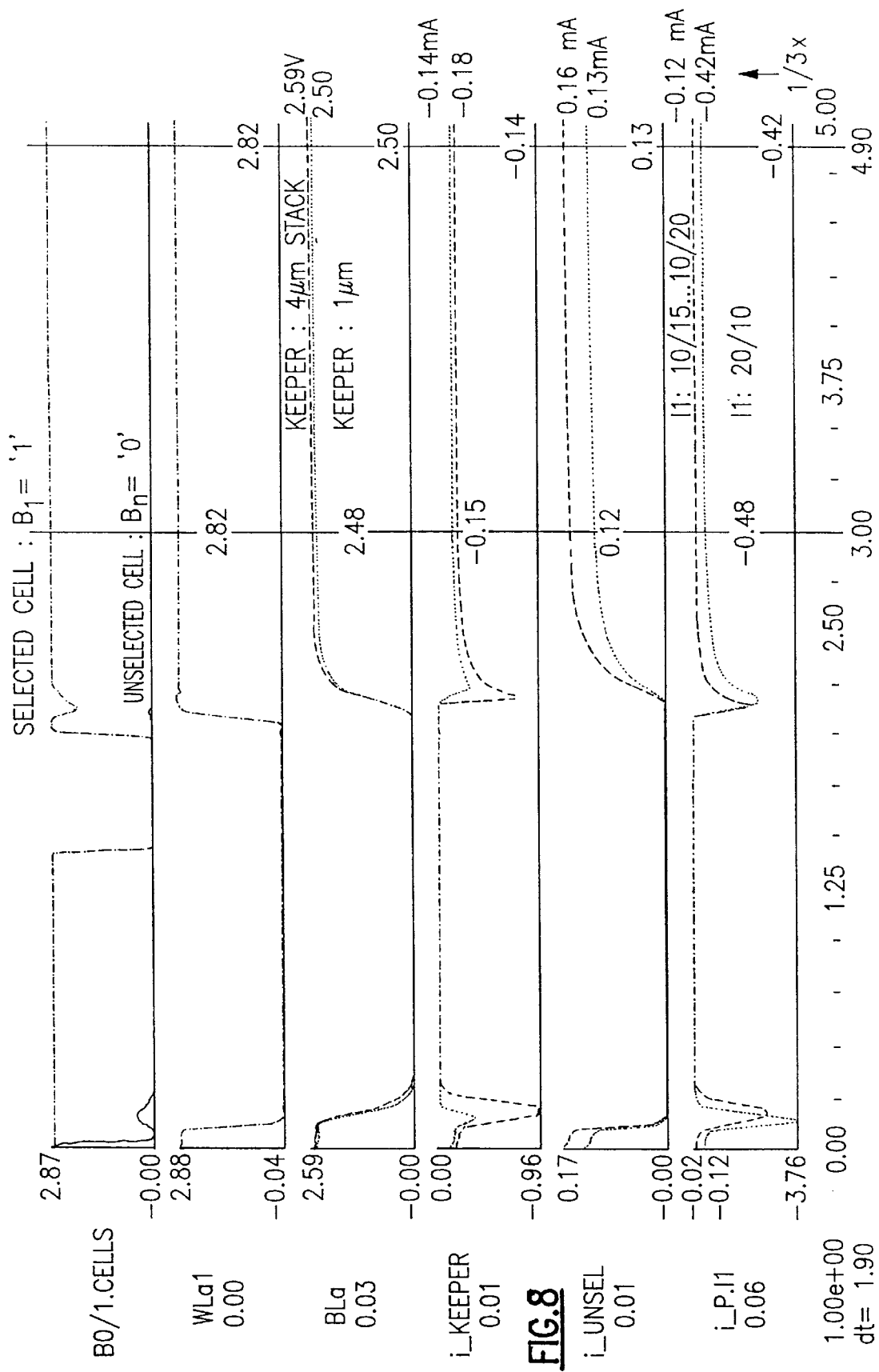

FIG. 8 New vs. prior-art sensing scheme in test mode (LT=1) at burn-in conditions, i.e. 1.5×Vdd=2.825 V (including 0.125 V tester tolerance), T=140° C., NRN=0.00;

dotted waveforms: prior art;

dashed waveforms: invention

Figure 9:
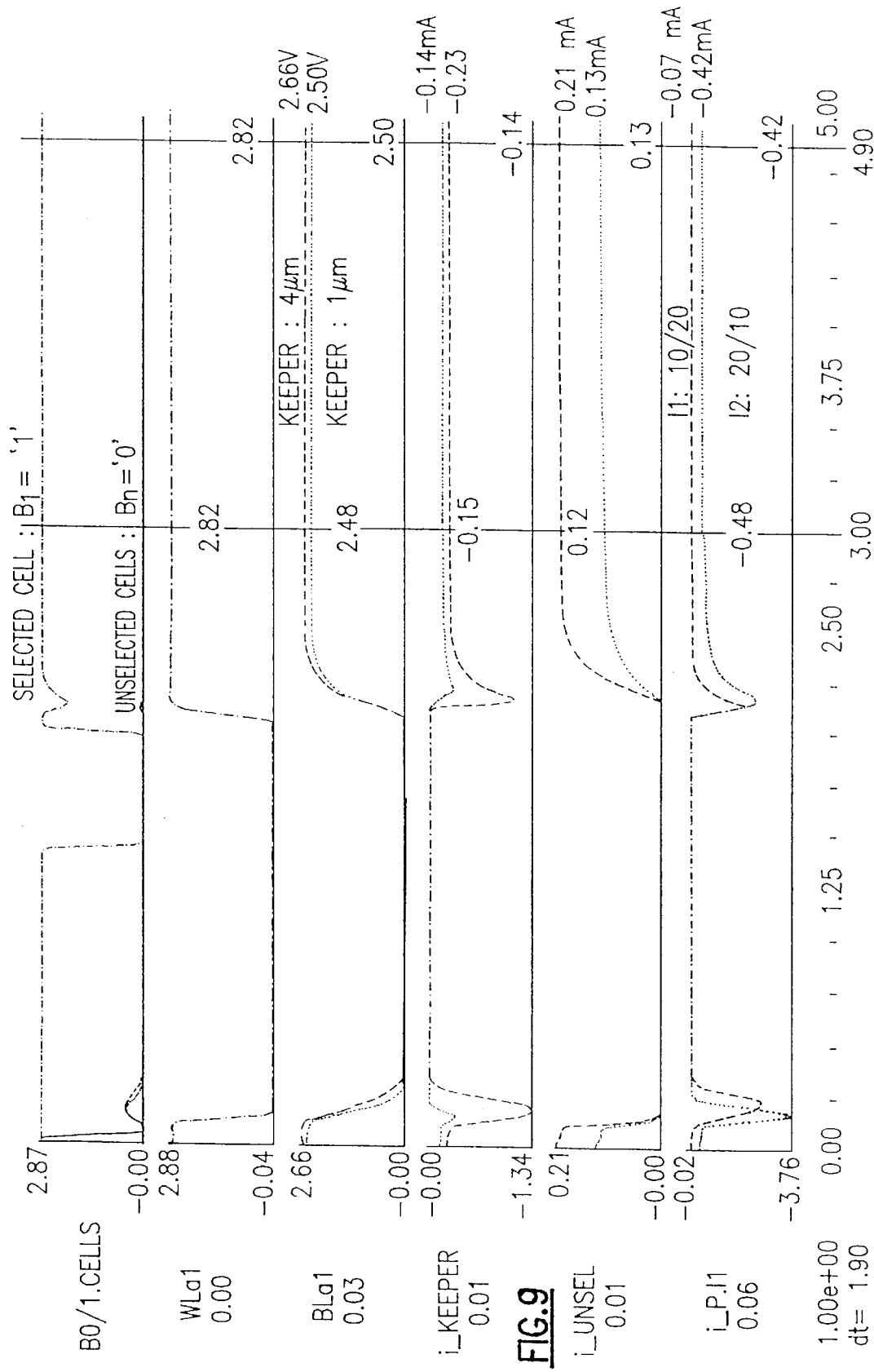

FIG. 9 New (circuit according to FIG. 3) vs. prior-art sensing scheme in test mode (LT=1) at burn-in conditions, i.e. 1.5×Vdd=2.825 V;

DETAILED DESCRIPTION OF THE INVENTION

Figure 2:
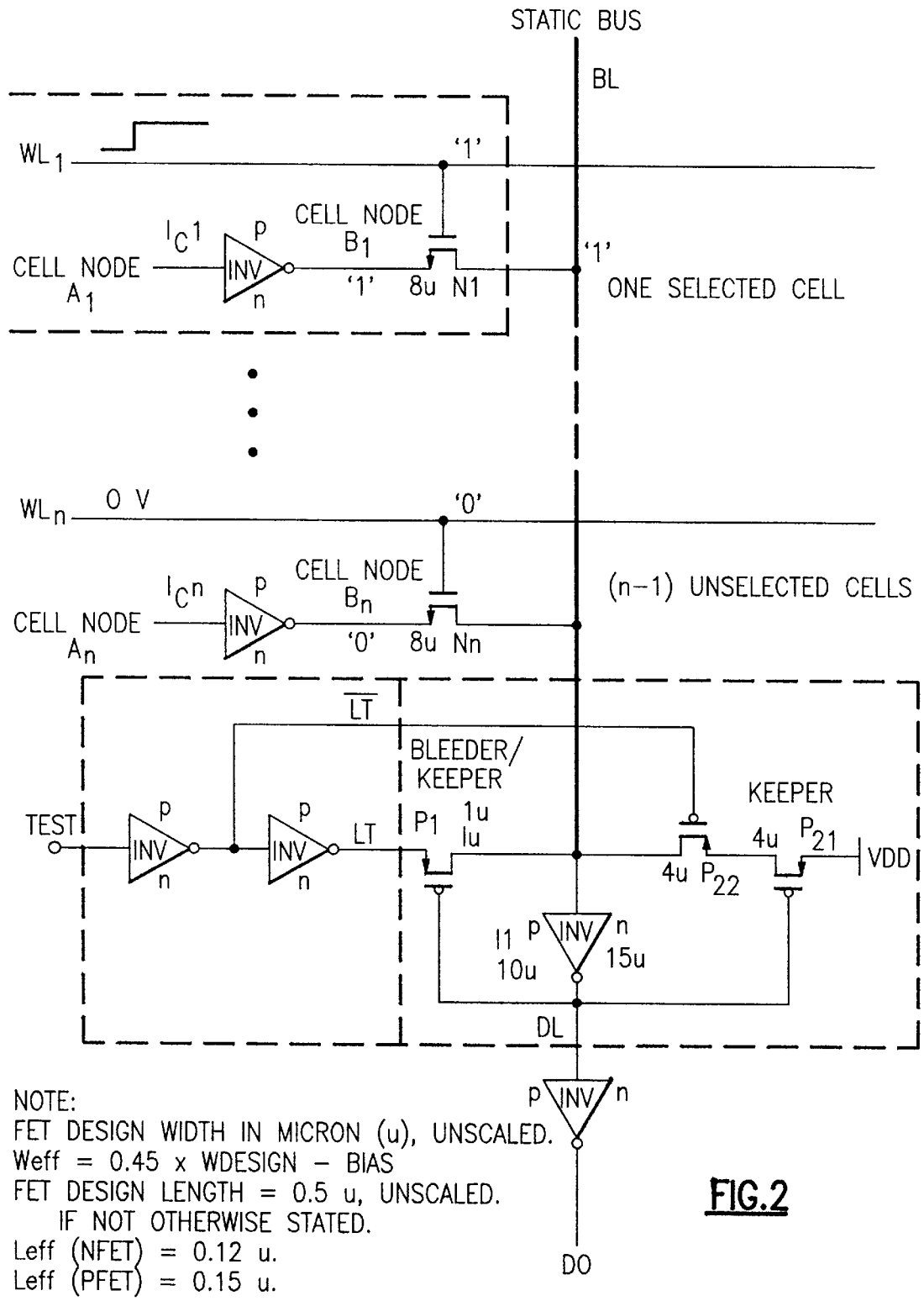
FIG. 2 Single-ended sensing with configurable half-latch according to the present invention FIG. 3 Configurable half-latch with switchable feedback loop according to the present invention FIG. 4 Switching behavior of prior art sensing scheme without keeper (1.5×Vdd=2.825 V (including 0.125 V tester tolerance))

A CMOS embodiment of the proposed circuit is shown in FIG. 2. It features a first PFET P1, the drain of which is connected to the bit line BL and the source of which is controlled by a signal LT for mode control, and a PFET stack of a second PFET P21 and a third PFET P22, the latter being gated by the inverse of LE the control signal LT. The gate terminals of both PFET P1 and PFET P21 are connected to the output of an inverter I1 which is attached to the read bit line BL to sense and amplify the signal received from the memory cell. The source of the second PFET P21 is connected to the supply voltage Vdd and the source of the third PFET P22 is connected to the drain of the second PFET P21, and the drain of the third PFET P22 is connected to the bit line BL. The control signal LT and the inverse of LT are generated by a dual stage inverter chain serving as control means for setting the control signal. The first inverter receives a DC control signal TEST.

For normal operation (system run mode), the signal TEST and thus LT is low, i.e. at ground (TEST='0'=0 V), and in case of reading a '1' out of the cell the PFET P1 is turned on and acts as small pull-down device or so-called bleeder device to prevent the bit line BL from drifting up towards Vdd by subthreshold currents. Thus, the swing on the bit line BL is limited to Vdd-VTn, resulting in a faster discharge time and hence better performance.

It should be noted that the read port NFET pass gates N1 ... Nn of the used multi-port memory cell can anyway drive the bit line BL only towards VDD-VTn within a reasonable time after which the switching point of the level detector/ sense amplifier I1 has been reached. Thus, from the sense amplifier's I1 point of view, there is no need to pull the bit line BL all the way up to Vdd. However, it is desirable to bound the up-level on the bit line BL to Vdd-VTn for fast read out of a low level stored in the memory cell.

The size of PFET P1 is optimized for the bleeder mode. It is chosen such that it can sink the subthreshold currents from all memory cells, when they have stored a high level of Vdd (=worst case).

The static inverter I1 is designed for a low (Vdd-VTn) to normal CMOS voltage level (Vdd) conversion by adjusting the switching threshold to a level of about one half of the bit line swing (Vdd-VTn). Therefore, its NFET is relatively large (e.g. channel width $W_n$=15 μm, unscaled dimension) as compared to the PFET (e.g. $W_p$=10 μm). Typically, the PFET/NFET width-to-length ratio is between 1 and ½ for early and fast up-level detection.

As the bleeder device PFET P1 sets the bit line up-level to Vdd-VTn or slightly below, a DC current will flow through the inverter I1, depending on the size of its PFET. To minimize this current, a buffer is attached to the output DL of the inverter I1, so that the inverter I1, particularly its PFET, can be designed as small as possible and optimized for '0'- and '1'-level detection.

Referring to the circuit schematic (FIG. 2) and the typical timing diagrams/waveforms from the simulations (FIG. 7), the read operation of the sensing scheme is as follows:

Assume that a logical '0' is stored in the memory cell with node B1 being low and that the bit line BL has been set high by a read '1' operation in the preceding cycle (worst case). Then the output of the inverter I1 is low, turning on the half-latch PFET P1. In case of a system operation with signal LT being low and a supply voltage of Vdd (1.7 V typically), P1 is active as bleeder device and the bit line up-level is close to Vdd-VT (e.g. 1.15 V).

When the read word line WL rises, the read-port NFET of the memory cell is turned on and discharges the bit line BL, creating a signal at the input of the sense amplifier. Here bleeder P1 is no obstacle to the discharging of the bit line, in contrast to the circuit in FIG. 1. With the static inverter I1 being used for bit line level detection, its output rises immediately after the input has passed through the switching threshold. Due to this fully static sensing scheme, there is no timing skew. The output response is fast, because the BL up-level is not so far away from the switching threshold as in the conventional scheme where the bit line is restored to Vdd (e.g. 1.70 V). The typical access time measured from the Read Address AA0 to the Data Output D0a (incl. a buffer subsequent after I1) is 14% faster (FIG. 7, dotted line) as compared to the case where signal LT is high and both keeper pathes were turned on initially (dashed line).

Reading a logical '1' (i.e. memory cell node B1 is high), the bit line BL is pulled up towards Vdd-VTn through the selected read port NFET N1. With the designed-in low switching point, the sense amplifier I1 switches already before the bit line has reached half of the up-level (e.g. 1.15 V in FIG. 7) guaranteed by the bleeder P1, which is below Vdd/2 (=0.85 V). Consequently, the sense amplifier's output DL goes down early, resulting in a fast read '1' access time. Because of the feedback, the bleeder P1 stays on and keeps the bit line up-level slightly below Vdd-VT.

In both cases, reading '0' and reading '1', the PFET stack P21/P22 is shut off by the signal TEST (=0 V).

In the test mode, the control signal TEST is high and thus LT is high (TEST='1'=Vdd), so that PFET P1 is configured to a keeper device, forming a half-latch together with the inverter I1. The weak keeper device PFET P1 is enhanced by a parallel keeper path established by the PFET stack P21/P22, which is only active in this mode.

For a leakage test the bit line BL is restored to full Vdd (e.g. 1.70 V), and the PFET in inverter I1 is shut off. Thus, there is no DC current flow through inverter I1, which otherwise would cover the leakage due to chip defects. Dynamic or enhanced voltage screen tests can be carried out at 1.7×Vdd or 2×Vdd, and burn-in at 1.5×Vdd.

The size of the PFET stack P21/P22 can be tuned for this task. Even relatively strong PFETs in this second path do not affect the performance in the system run mode, since here they will be switched off. The keeper sizes are chosen such that particularly at high-voltage and high-temperature operation during reliability screen tests they are able to restore the bit line close to Vdd within an operation cycle, in order to keep the DC current (cross current) through the inverter I1 at a minimum level. The worst case scenario is when all unselected cells contain a low-level and sink current due to the subthreshold effect in the read port NFETs N2 . . . Nn.

This new sense scheme is well-suited to minimize the path delay for normal read '0' and read '1 operations and to constrain the (DC) power dissipation during the various reliability screen tests, even at high voltages (1.5× to 2× of Vdd) and high temperatures (eg. 140° C. at burn-in).

For the use of the present invention in IBM 1.8 V CMOS7S/SOI technology the optimum device size were determined by a set of ASTAP (Transient Analysis Program) simulations at various run corners, particularly at the following corners:

Typical corner (example for system run mode):
  nominal process parameters (NRN=0.5): e.g. nominal $L_{eff}$
  low operating voltage: 0.92×Vdd=1.70 V
  high operating temperature: T=65° C.

Burn-in corner (example for a test mode):
  process parameters for fastest performance (NRN=0): e.g. minimum $L_{eff}$
  1.5×operating voltage: Vdd'=2.825 V (incl. 0.125 V tester tolerance)
  burn-in temperature: T=140° C.

(Vdd—supply voltage, $L_{eff}$—effective channel length, NRN—nominal random number, controlling the distribution of the process parameters)

Figure 1:
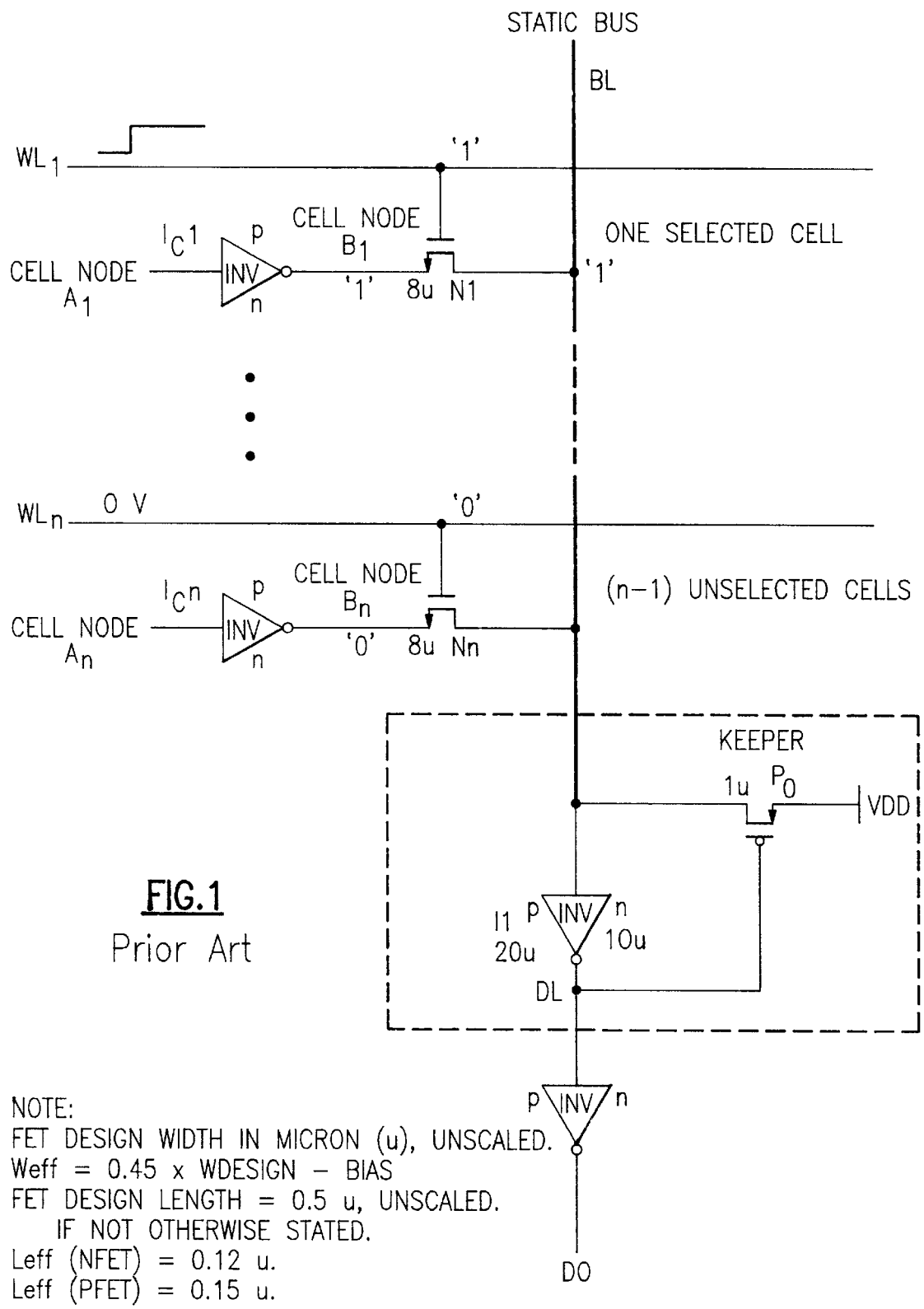
FIG. 1 Prior art single-ended sensing with half-latch
Figure 5:
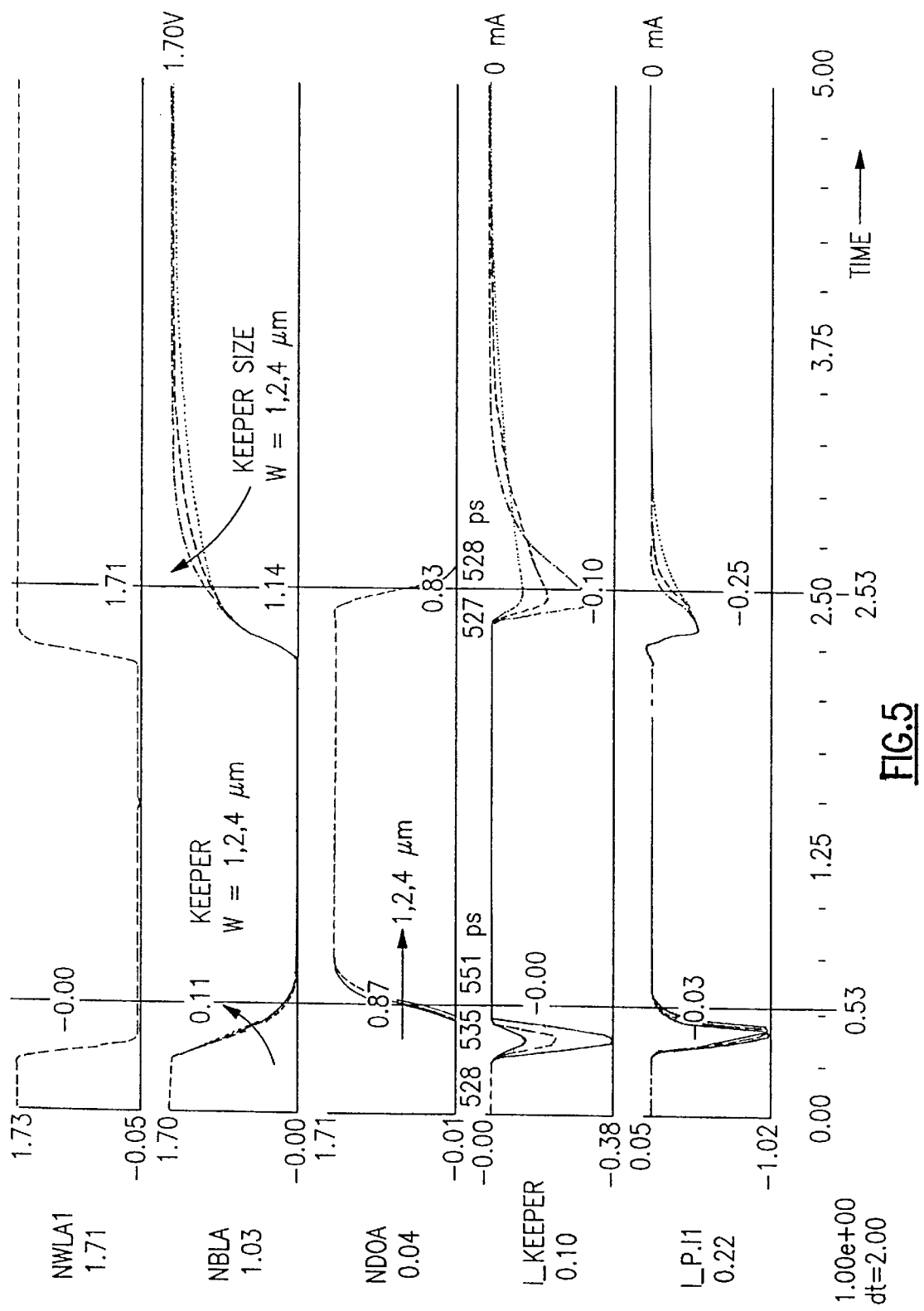
FIG. 5 Switching behavior of prior art sensing scheme at typical conditions, i.e. 0.92×Vdd=1.70 V, T=65° C., nominal random number NRN=0.50.

The circuits shown in FIG. 1 and 2 were compared by an ASTAP simulation of a 32×36-bit two-read-port SRAM macro implemented in IBM's CMOS7S/SOI technology. The obtained ASTAP waveforms are plotted in FIGS. 5/6 and FIGS. 7/8, respectively (node voltages and currents vs. time).

FIG. 6 shows that with the conventional half-latch scheme a PFET keeper device P1 with a keeper W/L ratio of only W/L=1.0/0.5 (unscaled dimension) is insufficient to restore the bit line to the full supply voltage Vdd at burn-in conditions, if all the attached unselected cells contain a '0' (0 V), and is insufficient to avoid excessive cross current and DC power consumption in the inverter stage. Due to the large subthreshold current through the 31 unselected cells (0.13 mA), the bit line reaches only a level of 2.52 V, which is 305 mV below the supply voltage of 1.5×Vdd=2.825 V (2.52 V in standby, at t=0). This leads to a DC current (i_P.I1) through the sensing inverter I1, which in standby is 40 times larger (0.4 mA), if all unselected cells contain a '0' as compared to a '1' (no subthreshold current: i_unsel=0) and which sums up to 14.4 mA for 36 data outputs ports.

FIG. 7 proves that with the new configurable half-latch the typical read '0' access time at the low-voltage corner (1.7 V) is improved by 14% over the keeper mode (LT=1), while the short '1' access time is maintained (498 ps).

According to FIG. 8, the configurable half latch can be designed such that it is capable to restore the bit line to a higher voltage (e.g. by 90 mV) in the burn-in test mode. This relatively increase in bit-line voltage along with a much smaller inverter I1 (W/L=10/15) reduces the DC current by a factor of 3 to 0.12 mA, as compared to the conventional half-latch (FIG. 6).

Figure 3:
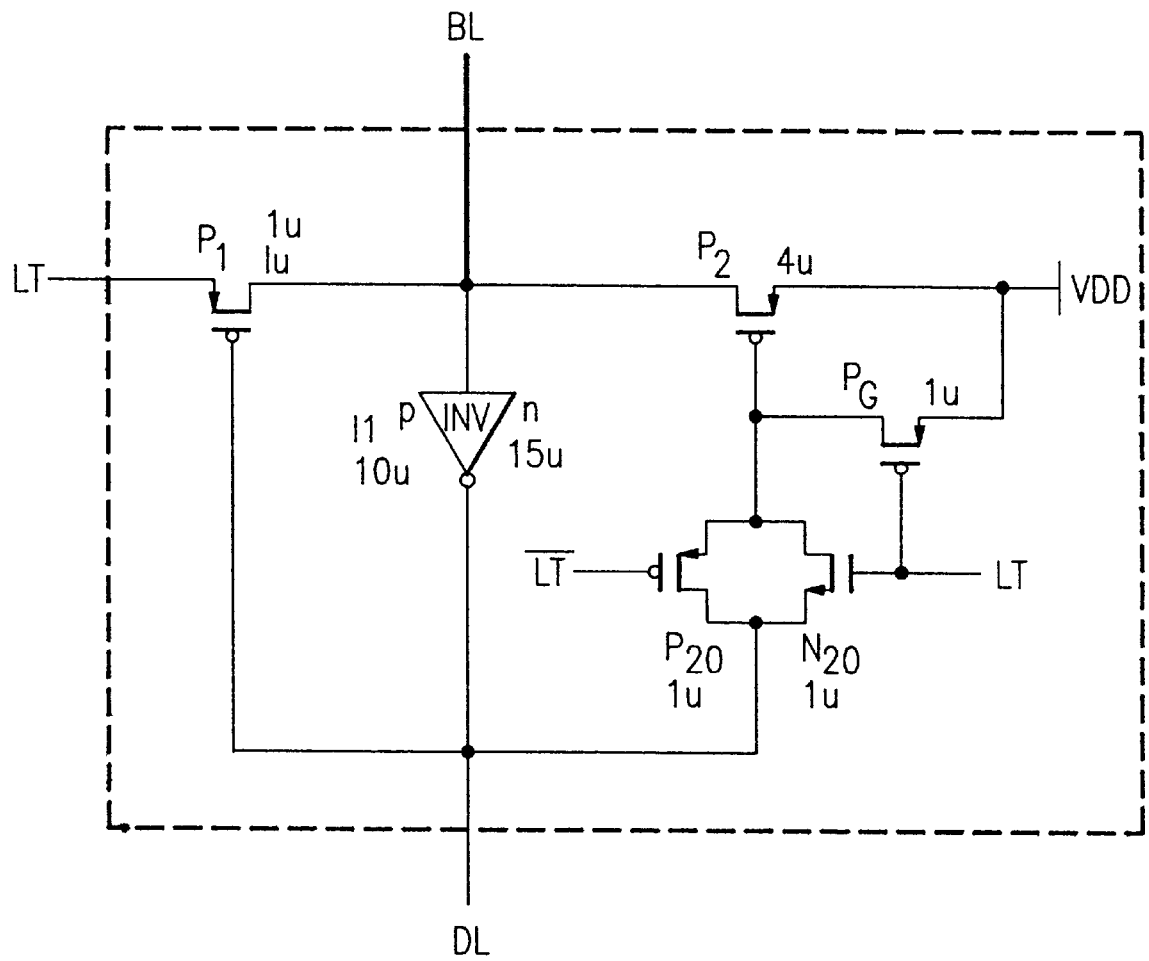
Figure 4:
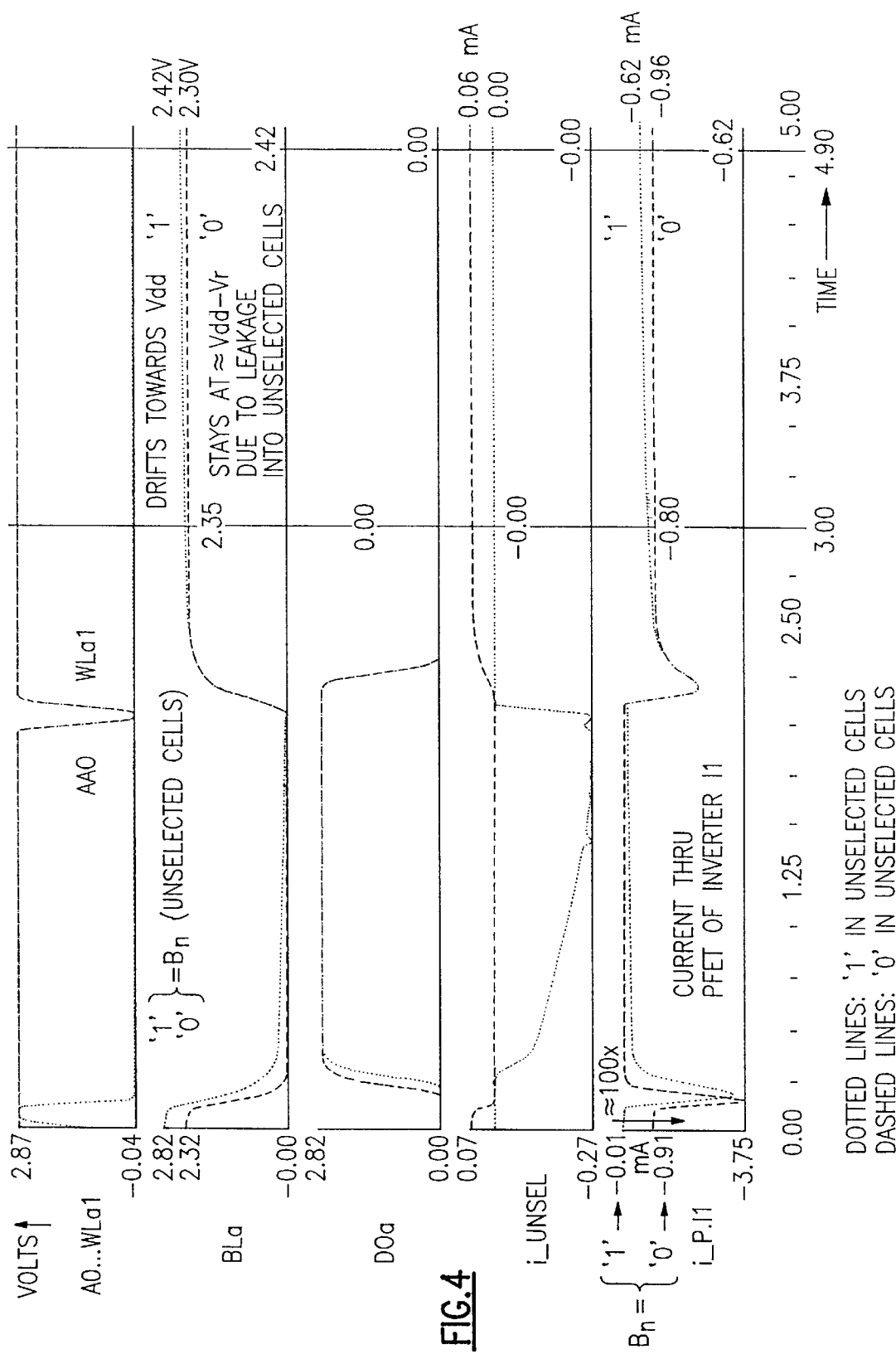

A higher BL up-level (FIG. 9) can be obtained by the circuit in FIG. 3, which features the inverter I1 and the first PFET P1 and where the second PFET feedback path comprises a single PFET keeper P2 rather than a two-high PFET stack. The gate of PFET P2 is controlled by a feedback loop which can be switched through a minimum-size CMOS transmission gate PFET P20/NFET N20 which is controlled by the signal LT and the inverse of LT. The drain of PFET P2 is connected to the bit line BL and the source of PFET P2 is connected to the supply voltage Vdd. Said circuit further features a PFET PG which shuts off the keeper PFET P2 in case of the system mode when LT is low. The gate of PFET PG is connected to the signal LT and the source is connected to Vdd and the drain is connected to the gate of PFET P2. The PFET P20 has a gate connected to the inverse of said control signal, a source connected to the gate of the PFET P2, and a drain connected to the output of said inverter I1, and the NFET N20 has a gate connected to said control signal, a source connected to the output of said inverter I1, and a drain connected to the gate of the PFET P2.

Thus, for a 32×36 two-read-port SRAM, a typical address access time of about 0.5 ns (from address to data ouput DO) can be achieved at 1.70 V ($Vdd_{min}$) with 0.12/0.15 μm CMOS/SOI devices, while functionality and moderate power consumption at burn-in (2.8 V, 140° C.) and even at voltage stresses with 2×Vdd=3.6 V is maintained.

It is clear for one skilled in the art that the idea of this invention can also be applied to a dynamic logic circuit.

We claim:

1. A circuit for sensing and amplifying a signal developed on a single bit line in a semiconductor memory which includes an inverter with half-latch, wherein
    said inverter has two PFET feedback paths, and wherein
        the first PFET path can be set up either as a bleeder device in the system run mode or as a keeper device in the test modes, and wherein the second PFET path is a configurable half-latch and can be set up as a keeper device in the test modes and can be switched off in the system run mode, and wherein said two PFET feedback paths are controlled by a control signal for setting up the circuit for either the system run mode or for the test modes, and wherein the second PFET path comprises a PFET stack which includes a second PFET and a third PFET, with said first and second PFETs each having a source, a drain and a gate, wherein the sources of the second PFET and the third PFET are respectively connected to supply voltage and the drain of the second PFET, and wherein the drains of the second PFET and the third PFET are respectively connected to the source of the third PFET and the bit line, and wherein the gates of the second PFET and the third PFET are respectively connected to the output of the inverter and the inverse of said control signal.

2. A circuit for sensing and amplifying a signal developed on a single bit line in a semiconductor memory which includes an inverter with half-latch, wherein said inverter has two PFET feedback paths, and wherein the first PFET path can be set up either as a bleeder device in the system run mode or as a keeper device in the test modes, and wherein the second PFET path is a configurable half-latch and can be set up as a keeper device in the test modes and can be switched off in the system run mode, and wherein said two PFET feedback paths are controlled by a control signal for setting up the circuit for either the system run mode or for the test modes, and wherein the second PFET path comprises a fourth PFET, a fifth PFET, and a CMOS transmission gate which includes a sixth PFET and a NFET, and wherein the fourth PFET includes a gate connected to the source of said sixth PFET, a source connected to the supply voltage, and a drain connected to the bit line, and wherein the fifth PFET includes a gate connected to said control signal, a source connected to the supply voltage, and a drain connected to the gate of the fourth PFET, and wherein the sixth PFET includes a gate connected to the inverse of said control signal, a source connected to the gate of the fourth PFET, and a drain connected to the output of said inverter, and wherein the NFET includes a gate connected to said control signal, a source connected to the output of the inverter, and a drain connected to the gate of the fourth PFET.

3. A circuit for sensing and amplifying a signal developed on a single bit line in a semiconductor memory which includes an inverter with half-latch, wherein said inverter comprises 2 PFET feedback paths, and wherein the first PFET path can be set up either as a bleeder device in the system run mode or as a keeper device in the test modes, and wherein the second PFET path is a configurable half-latch and can be set up as a keeper device in the test modes and can be switched off in the system run mode, and wherein said 2 PFET feedback paths are controlled by a control signal for setting up the circuit for either the system run mode or for the test modes;

said circuit further comprises control means for setting said control signal;

said inverter is attached to the bit line to sense and amplify the signal received from a memory cell in said memory;

the first PFET path comprises a first PFET, having a drain connected to the bit line, a source controlled by the control signal, and a gate connected to the output of the inverter; and the second PFET path comprises a PFET stack which includes a second PFET and a third PFET, each of said first and second PFETs having a source, a drain and a gate, wherein the sources of the second PFET and the third PFET are respectively connected to a supply voltage and to the drain of the second PFET, and wherein the drains of the second PFET and the third PFET are respectively connected to the source of the third PFET and the bit line, and wherein the gates of the second PFET and the third PFET are respectively connected to the output of the inverter and the inverse of said control signal; and control means set up the circuit for the system run mode by setting the control signal to a first state, and said control means set up the circuit for test modes by setting the control signal to a second state; and in case of system run mode the first PFET acts as bleeder device and the second PFET path is switched off; and in case of test modes a first PFET is configured as a keeper device, forming a half-latch together with an inverter and said first PFET is enhanced by a parallel keeper path established by a PFET stack.

4. The circuit of claim 3, wherein instead of the PFET stack a fourth PFET together with a fifth PFET and a CMOS transmission gate are used, and wherein the second PFET path comprises the fourth PFET, the fifth PFET, and the CMOS transmission gate which includes a sixth PFET and a NFET, and wherein the fourth PFET includes a gate connected to the source of said sixth PFET, a source connected to the supply voltage, and a drain connected to the bit line, and wherein the fifth PFET comprises a gate connected to said control signal, a source connected to a supply voltage, and a drain connected to the gate of the fourth PFET, and wherein the sixth PFET includes a gate connected to the inverse of said control signal, a source connected to the gate of the fourth PFET, and a drain connected to the output of said NFET, and wherein the NFET includes a gate connected to said control signal, a source connected to the drain of the sixth PFET, and a drain connected to the gate of the fourth PFET, and wherein in case of system run mode the fifth PFET is connected so as to shut off the fourth PFET.

\* \* \* \* \*